(12) United States Patent
Williams

(10) Patent No.: US 11,067,603 B2
(45) Date of Patent: Jul. 20, 2021

(54) CONNECTOR HAVING CONTACT MEMBERS

(71) Applicant: GITech Inc., Austin, TX (US)

(72) Inventor: John Williams, Austin, TX (US)

(73) Assignee: GITech Inc., Austin, TX (US)

(*) Notice: Subject to any disclaimer, the term of this patent is extended or adjusted under 35 U.S.C. 154(b) by 168 days.

(21) Appl. No.: 16/394,247

(22) Filed: Apr. 25, 2019

(65) Prior Publication Data

US 2019/0391180 A1 Dec. 26, 2019
US 2021/0055329 A9 Feb. 25, 2021

Related U.S. Application Data

(63) Continuation-in-part of application No. 16/246,529, filed on Jan. 13, 2019.

(30) Foreign Application Priority Data

Apr. 30, 2018 (TW) .................................. 107114634
May 17, 2018 (CN) .......................... 201810474999.1
Jun. 25, 2018 (TW) .................................. 107121644

(51) Int. Cl.
 *H01R 12/71* (2011.01)
 *H01R 13/66* (2006.01)
 (Continued)

(52) U.S. Cl.
 CPC ..... *G01R 1/07378* (2013.01); *G01R 1/06733* (2013.01); *G01R 31/2886* (2013.01);
 (Continued)

(58) Field of Classification Search
 CPC ... G01R 1/06727; G01R 1/18; G01R 1/07342
 See application file for complete search history.

(56) References Cited

U.S. PATENT DOCUMENTS 5,259,781 A * 11/1993 Baumberger ...... H01R 13/2435
 439/331
5,358,411 A * 10/1994 Mroczkowski .... H01R 13/2435
 439/66
(Continued)

FOREIGN PATENT DOCUMENTS

CN 2927364 Y 7/2007
CN 201438572 U 4/2010
(Continued)

OTHER PUBLICATIONS

Office Action for Korean Application No. KR20190069459, dated Apr. 13, 2020, 4 pages.
(Continued)

*Primary Examiner* — Jean F Duverne
(74) *Attorney, Agent, or Firm* — Carmen C. Cook

(57) ABSTRACT

An electrical connector comprises a bottom assembly extending in a first direction, a first contact assembly, a first substrate assembly, a second contact assembly, a second substrate assembly, a third contact assembly, a top assembly and a plurality of conductive vias. The bottom assembly, the first contact assembly, the first substrate assembly, the second contact assembly, the second substrate assembly, the third contact assembly, and the top assembly are arranged in a second direction. The plurality of conductive vias extends in the second direction to penetrate the bottom assembly, the first substrate assembly, the second substrate assembly, and the top assembly. Each of the contact member of the first contact assembly, the second contact assembly, and the third contact assembly are of a letter V shape.

20 Claims, 15 Drawing Sheets

(51) Int. Cl.
    *H01R 13/24*     (2006.01)
    *G01R 1/073*     (2006.01)
    *H05K 1/11*     (2006.01)
    *H01R 13/502*     (2006.01)
    *G01R 1/067*     (2006.01)
    *G01R 31/28*     (2006.01)

(52) U.S. Cl.
    CPC ....... H01R 12/714 (2013.01); H01R 13/2435 (2013.01); H01R 13/502 (2013.01); H01R 13/6625 (2013.01); H05K 1/111 (2013.01); H05K 1/115 (2013.01); *H01R 2201/20* (2013.01)

(56) References Cited

U.S. PATENT DOCUMENTS

| | | | |
|---|---|---|---|
| 5,415,559 A * | 5/1995 | Ichimura | H01R 13/2435 |
| | | | 439/259 |
| 5,628,635 A | 5/1997 | Ikeya | |
| 6,400,169 B1 | 6/2002 | Hembree | |
| 6,559,665 B1 | 5/2003 | Barabi | |
| 6,709,279 B2 * | 3/2004 | Uratsuji | G01R 1/0483 |
| | | | 439/66 |
| 6,746,261 B2 * | 6/2004 | Petit | H05K 7/023 |
| | | | 361/704 |
| 7,722,361 B2 | 5/2010 | Lopez et al. | |
| 7,956,631 B2 | 6/2011 | Chen et al. | |
| 7,989,945 B2 | 8/2011 | Williams et al. | |
| 8,373,428 B2 * | 2/2013 | Eldridge | B23K 20/004 |
| | | | 324/754.14 |
| 2004/0252477 A1 | 12/2004 | Brown et al. | |
| 2007/0275572 A1 | 11/2007 | Williams et al. | |
| 2018/0376610 A1 | 12/2018 | Kawabata | |

FOREIGN PATENT DOCUMENTS

| | | |
|---|---|---|
| CN | 203871520 U | 10/2014 |
| TW | M377746 | 4/2010 |
| TW | M377746 U | 4/2010 |
| TW | I331423 B | 10/2010 |
| TW | 201112505 | 4/2011 |
| TW | 201112505 A | 4/2011 |
| TW | I556084 B | 11/2016 |

OTHER PUBLICATIONS

Office Action and Search Report for China Application No. 201810474999.1, dated May 28, 2020, 8 pages.

* cited by examiner

CONNECTOR HAVING CONTACT MEMBERS

CROSS-REFERENCE TO RELATED APPLICATIONS

This Patent Application claims the benefit of Patent Application No. TW107121644 in Taiwan, Republic of China filed on Jun. 25, 2018. This Patent Application is a Continuation-in-part application of U.S. patent application Ser. No. 16/246,529 filed on Jan. 13, 2019, which claims the benefit of Patent Application No. TW107114634 filed in Taiwan, Republic of China on Apr. 30, 2018, and claims the benefit of Patent Application No. CN201810474999.1 filed in People's Republic of China on May 17, 2018. The disclosure made in U.S. Pat. No. 7,989,945 to Williams et al., the disclosure made in the Patent Application TW107121644, and the disclosure made in the patent application Ser. No. 16/246,529 are hereby incorporated by reference.

FIELD OF THE INVENTION

This invention relates generally to an electrical connector. More particularly, the present invention relates to an electrical connector having contact members configured as a modular unit.

BACKGROUND OF THE INVENTION

FIG. 1 shows a cross-sectional view of a conventional testing apparatus 9. The testing apparatus 9 facilitates testing of a device under test (DUT) 900. The DUT 900 can be any form of packaged integrated circuit (IC) derived from a wafer. The testing apparatus 9 includes a base 91 and a plurality of spring probes 92. During testing, the plurality of spring probes 92 are electrically connected to the DUT 900. The design of the testing apparatus 9 and locations of the plurality of spring probes 92 are determined based on the input and output locations of the DUT 900. The type, size, and shape of DUT may vary which in turn requires various socket configurations to be considered. New test configurations result in specific testing apparatuses to be deployed to match DUT foot prints at the expense of additional manufacturing cost to the customer.

Current testing methods require the plurality of spring probes 92 that directly contact pads or solder balls of the DUT 900 to test electrical signals. Certain testing methods further require a predetermined force to move the plurality of spring probes 92 so as to generate frictional motion relative to the contact pads of the DUT 900. Certain testing methods still further require a predetermined pressure applied to the contact interfaces between the plurality of spring probes 92 and the pads of the DUT 900.

One advantage of the electrical connector of the present disclosure is its scalable nature. The electrical connector may be employed to test various electronic devices.

SUMMARY OF THE INVENTION

An electrical connector (unit) comprises a bottom assembly, a first contact assembly, a first substrate assembly, a second contact assembly, a second substrate assembly, a third contact assembly, a top assembly and a plurality of conductive columns or vias. The bottom assembly, the first contact assembly, the first substrate assembly, the second contact assembly, the second substrate assembly, the third contact assembly, and the top assembly are arranged in the given order. Interspersed between the above-mentioned assemblies are a plurality of conductive columns or via structures that enable electrical connection throughout conductive layers or circuitry located in the bottom assembly, the first substrate assembly, the second substrate assembly, and the top assembly. The design and construction of such a connector (unit) provides a unique ability to manipulate electrical responses between the connector (unit) and the apparatus it is electrically connecting to.

The bottom assembly comprises a bottom conductive layer and a bottom insulation layer. The first contact assembly comprises a first plurality of contact members, the second contact assembly comprises a second plurality of contact members, and the third contact assembly comprises a third plurality of contact members. The first substrate assembly comprises a first substrate layer, a first conductive layer, and a first encapsulation layer. The second substrate assembly comprises a second encapsulation layer, a second conductive layer, and a second substrate layer. The top assembly comprises a top insulation layer and a top conductive layer.

DETAILED DESCRIPTION OF THE INVENTION

Figure 1:
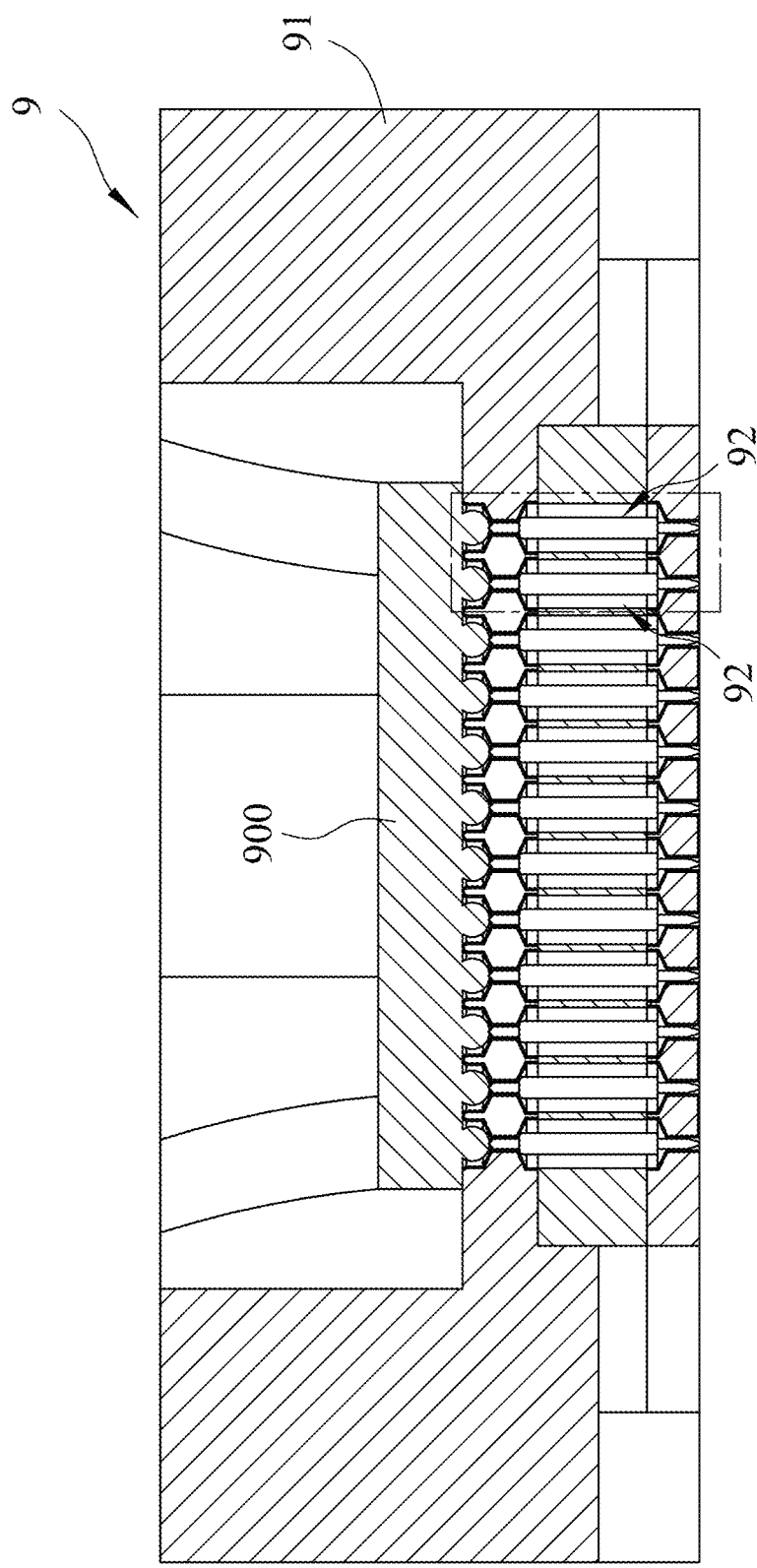
FIG. 1 is a cross-sectional view of a conventional testing apparatus.
Figure 2:
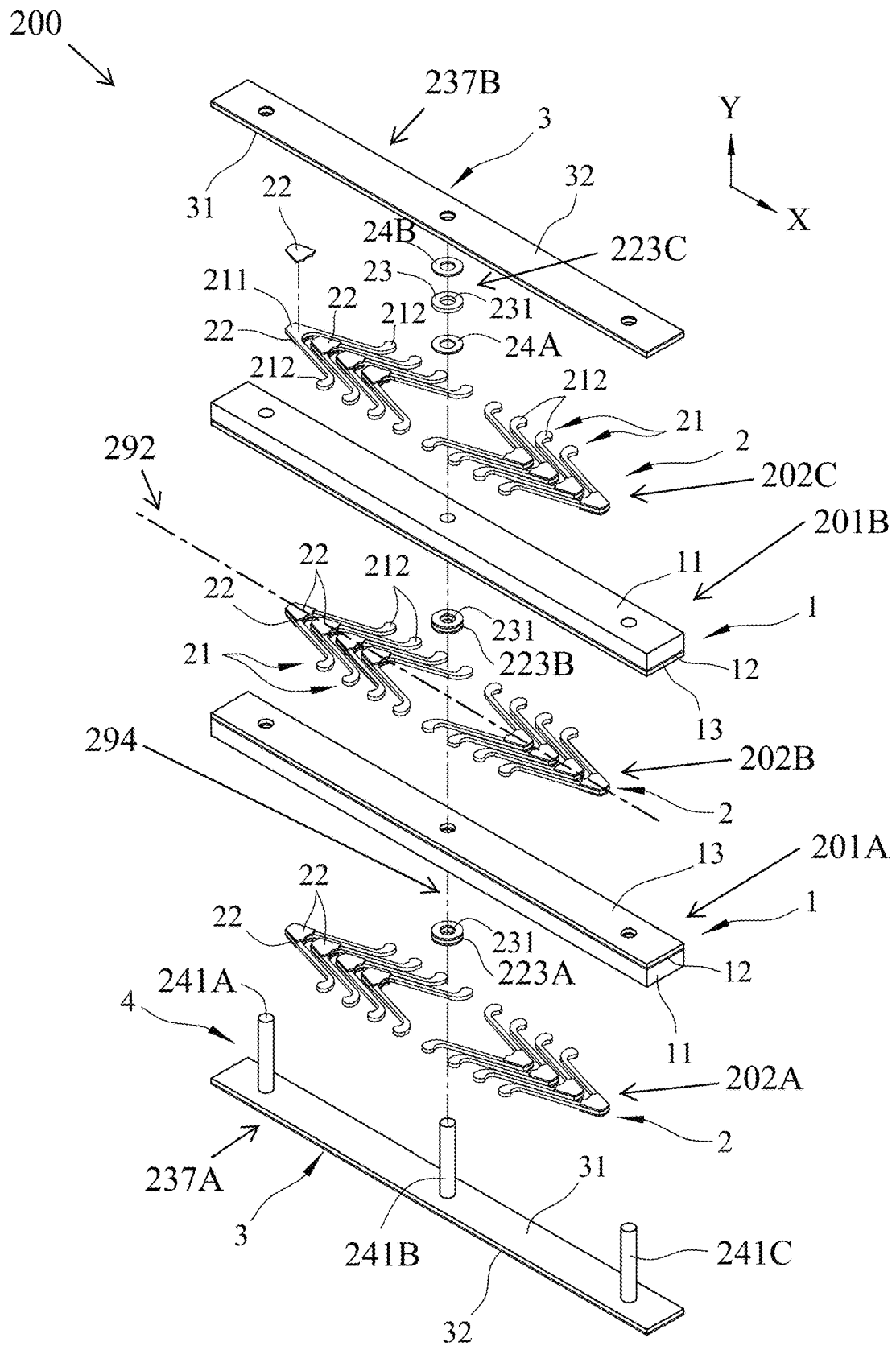
FIG. 2 is an exploded plot of an electrical connector in examples of the present disclosure.
Figure 3:
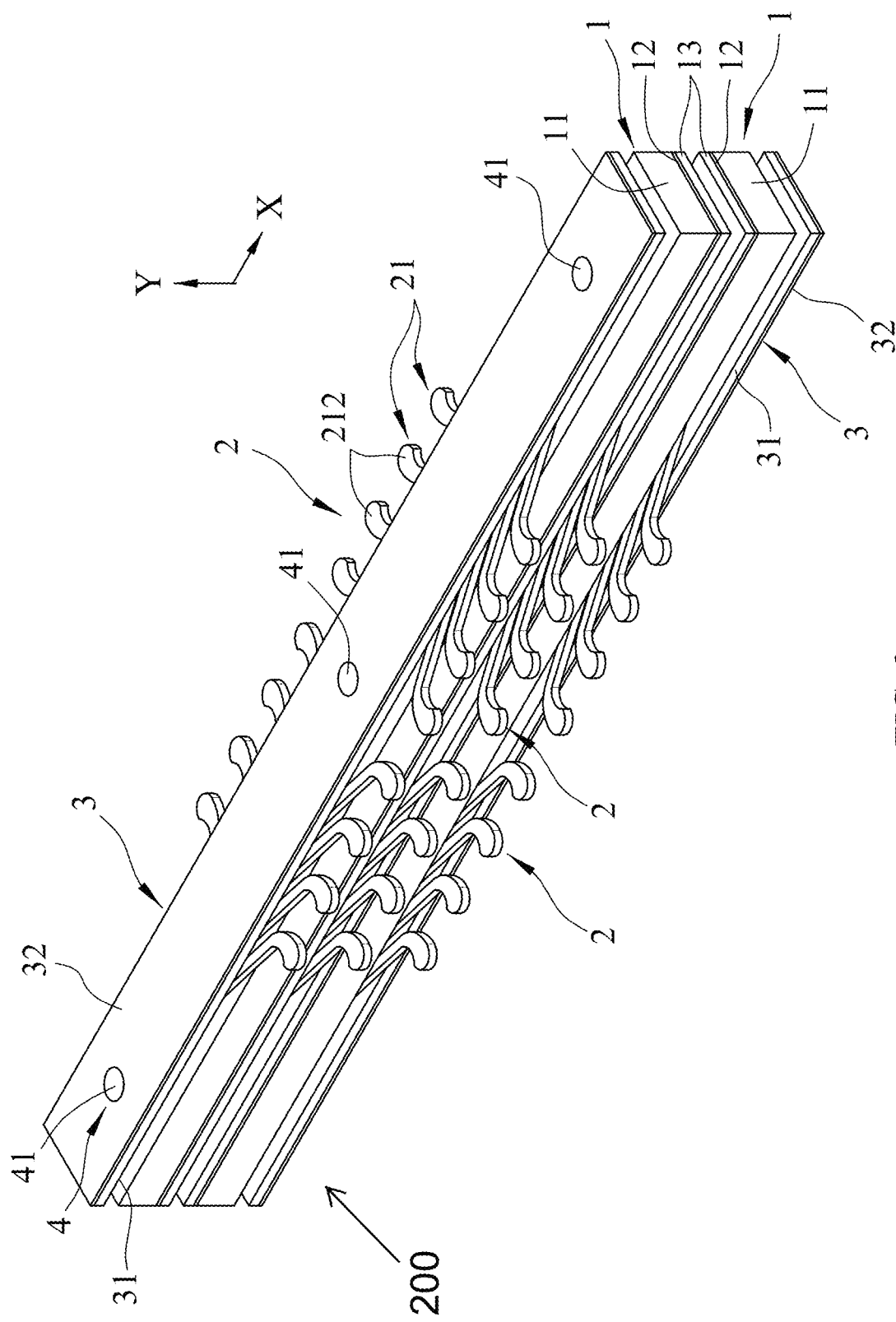
FIG. 3 is an assembled perspective view of the electrical connector of FIG. 2.
Figure 4:
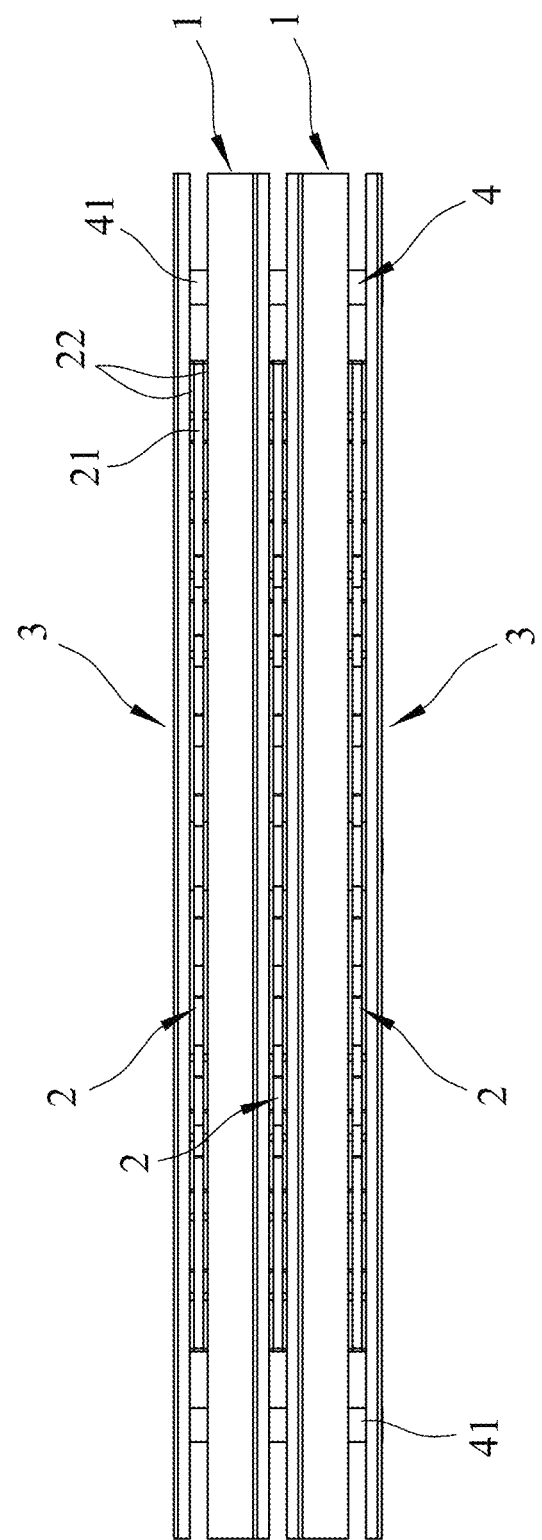
FIG. 4 is a top view of the electrical connector of FIG. 2.
Figure 6:
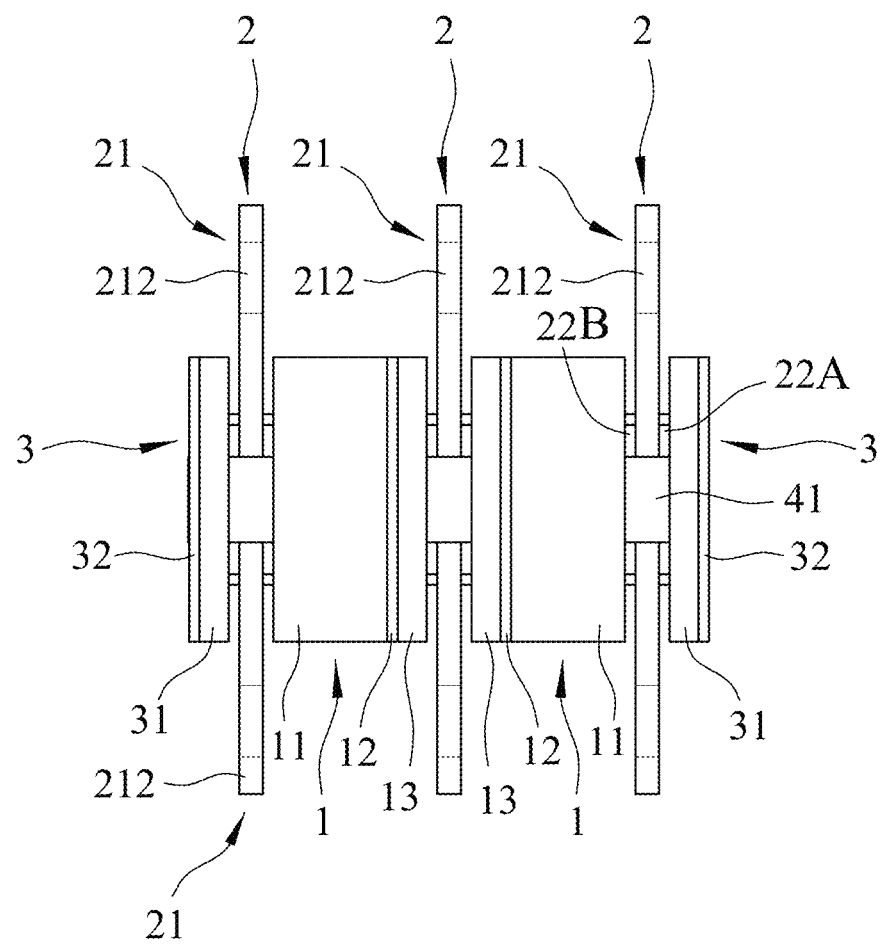
FIG. 6 is an end view of the electrical connector of FIG. 2.

FIG. 2 is an exploded plot, FIG. 3 is an assembled perspective view, FIG. 4 is a top view and FIG. 6 is an end view of an electrical connector 200 in examples of the present disclosure. The electrical connector 200 includes a plurality of substrate assemblies 1, a plurality of contact assemblies 2 comprising a plurality of bases 211 and a plurality of arms 212, a plurality of spacers 22, and a plurality of surface assemblies 3.

In examples of the present disclosure, the electrical connector 200 comprises a bottom assembly 237A, a first contact assembly 202A, a first substrate assembly 201A, a second contact assembly 202B, a second substrate assembly 201B, a third contact assembly 202C, a top assembly 237B and a plurality of conductive columns and vias 4 (for example, 241A, 241B, and 241C).

In examples of the present disclosure, the bottom assembly 237A extends along X-direction. The bottom assembly 237A comprises a bottom conductive layer 32 and a bottom insulation layer 31. In one example, the bottom conductive layer 32 has a constant thickness. In one example, the bottom insulation layer 31 has a constant thickness.

In examples of the present disclosure, the first contact assembly 202A comprises a first plurality of contact members 21, the second contact assembly 202B comprises a second plurality of contact members 21, and the third contact assembly 202C comprises a third plurality of contact members 21.

In examples of the present disclosure, the first substrate assembly 201A comprises a first substrate layer 11, a first conductive layer 12, and a first encapsulation layer 13. In one example, the first substrate layer 11 has a constant thickness. The first conductive layer 12 has a constant thickness. The first encapsulation layer 13 has a constant thickness. In examples of the present disclosure, a bottom surface of the first conductive layer 12 is directly attached to a top surface of the first substrate layer 11. A bottom surface of the first encapsulation layer 13 is directly attached to a top surface of the first conductive layer 12.

In examples of the present disclosure, the second substrate assembly 201B comprises a second encapsulation layer 13, a second conductive layer 12, and a second substrate layer 11. In one example, the second encapsulation layer 13 has a constant thickness. The second conductive layer 12 has a constant thickness. The second substrate layer 11 has a constant thickness. In examples of the present disclosure, a bottom surface of the second conductive layer 12 is directly attached to a top surface of the second encapsulation layer 13. A bottom surface of the second substrate layer 11 is directly attached to a top surface of the second conductive layer 12.

In examples of the present disclosure, the top assembly 237B extends along X-direction. The top assembly 237B comprises a top insulation layer 31 and a top conductive layer 32. In one example, the top insulation layer 31 has a constant thickness. In one example, the top conductive layer 32 has a constant thickness.

In examples of the present disclosure, the bottom assembly 237A, the first contact assembly 202A, the first substrate assembly 201A, the second contact assembly 202B, the second substrate assembly 201B, the third contact assembly 202C, and the top assembly 237B are arranged in the given order in Y-direction.

In examples of the present disclosure, the plurality of conductive vias 4, comprising a plurality of separated vias 41, penetrate and electrically connect to the bottom assembly 237A, the first substrate assembly 201A, the second substrate assembly 201B, and the top assembly 237B.

In examples of the present disclosure, the first contact assembly 202A further comprises a first spacer assembly 223A. The second contact assembly 202B further comprises a second spacer assembly 223B. The third contact assembly 202C further comprises a third spacer assembly 223C. In examples of the present disclosure, each of the first spacer assembly 223A, the second spacer assembly 223B, and the third spacer assembly 223C comprises a lower spacer 24A, a center conductive disk 23, and an upper spacer 24B. A top surface of the lower spacer 24A is directly attached to a bottom surface of the center conductive disk 23. A bottom surface of the upper spacer 24B is directly attached to a top surface of the center conductive disk 23.

In examples of the present disclosure, the plurality of conductive vias 4 comprise a first conductive via 241A, a center conductive via 241B, and a second conductive via 241C. The first conductive via 241A, the center conductive via 241B, and the second conductive via 241C are arranged along the X-direction. The center conductive via 241B passes through a center hole of the lower spacer 24A, a center hole 231 of the center conductive disk 23, and a center hole of the upper spacer 24B.

In examples of the present disclosure, the center conductive disk 23 is of a circular disk shape. The center conductive via 241B is of a cylinder shape.

In examples of the present disclosure, the electrical connector 200 is symmetric with respect to a centerline 292 of the electrical connector 200. The centerline 292 is parallel to X-direction. The electrical connector is symmetric with respect to a symmetric line 294 of the electrical connector 200. The symmetric line 294 is perpendicular to the centerline 292. The symmetric line 294 passes through a centroid of the center conductive via 241B.

In examples of the present disclosure, the first substrate assembly 201A and the second substrate assembly 201B are of rectangular prism shapes.

Figure 5:
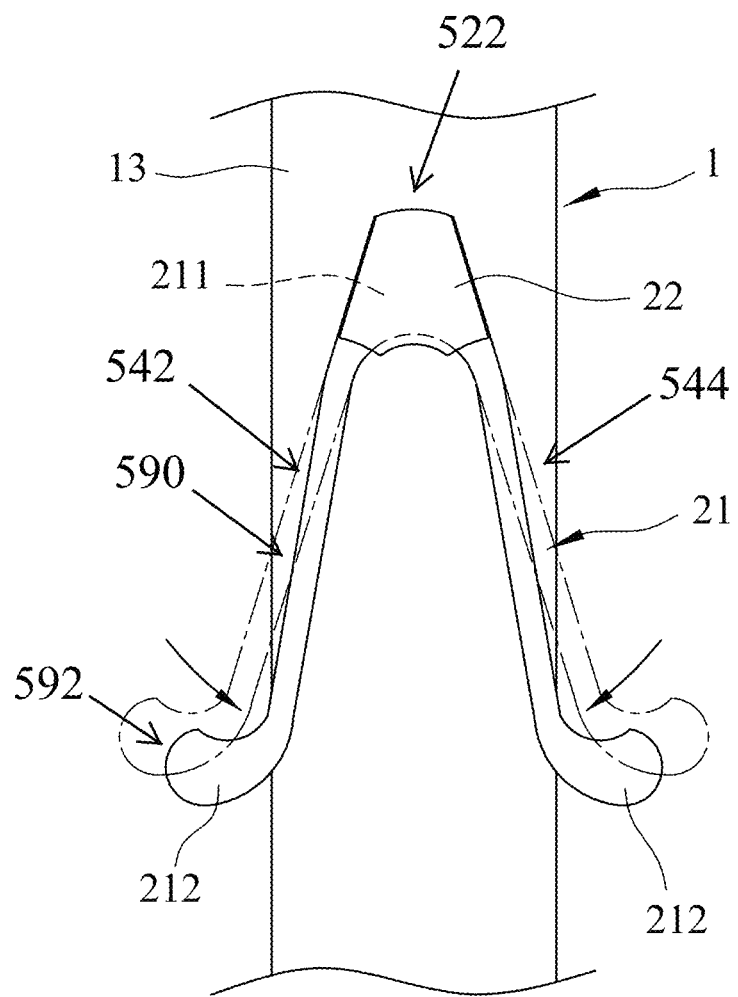
FIG. 5 is a frontal view of one or more contact members in examples of the present disclosure.

FIG. 5 is a frontal view of a contact member 21 in examples of the present disclosure. In examples of the present disclosure, the contact member 21 comprises a base portion 522, a first arm 542, a second arm 544, a first spacer 22A of FIG. 6, and second spacer 22B of FIG. 6. The first arm 542; the base portion 522; and the second arm 544 form a letter V shape. A top surface of the first spacer 22A is directly attached to a bottom surface of the base portion 522. A bottom surface of the second spacer 22B is directly attached to a top surface of the base portion 522.

In examples of the present disclosure, the first arm 542 and the second arm 544 are under in-plane flexural deflection.

In examples of the present disclosure, the center conductive via 241B of FIG. 2 is located at an opening side of each letter V shape of FIGS. 2 and 5.

In examples of the present disclosure, a top surface of each first arm 542 of the first contact assembly 202A and a top surface of each second arm 544 of the first contact assembly 202A are co-planar. A top surface of each first arm 542 of the second contact assembly 202B and a top surface of each second arm 544 of the second contact assembly 202B are co-planar. A top surface of each first arm 542 of the third contact assembly 202C and a top surface of each second arm 544 of the third contact assembly 202C are co-planar.

In examples of the present disclosure, each first arm 542 and second arm 544 comprises a slender portion 590 and an end portion 592. A length of the slender portion 590 is larger than a length of the end portion 592. A width of the slender portion 590 is smaller than a width of the end portion 592. In examples of the present disclosure, a majority portion of the end portion 592 is of an arc shape.

From FIGS. 2-6, a bottom surface of the first spacer 22A of FIG. 6 of each of the first contact assembly 202A directly contacts a top surface of the bottom insulation layer of the bottom assembly 237A. A top surface of the second spacer 22B of FIG. 6 of each of the first contact assembly 202A directly contacts a bottom surface of the first substrate layer of the first substrate assembly 201A. A bottom surface of the first spacer of each of the second contact assembly 202B directly contacts a top surface of the first encapsulation layer of the first substrate assembly 201A. A top surface of the second spacer of each of the second contact assembly 202B directly contacts the second encapsulation layer of the second substrate assembly 201B. A bottom surface of the first spacer of each of the third contact assembly 202C directly contacts a top surface of the second substrate layer of the second substrate assembly 201B. A top surface of the second spacer of each of the third contact assembly 202C directly contacts a bottom surface of the top insulation layer of the top assembly 237B.

Figure 7:
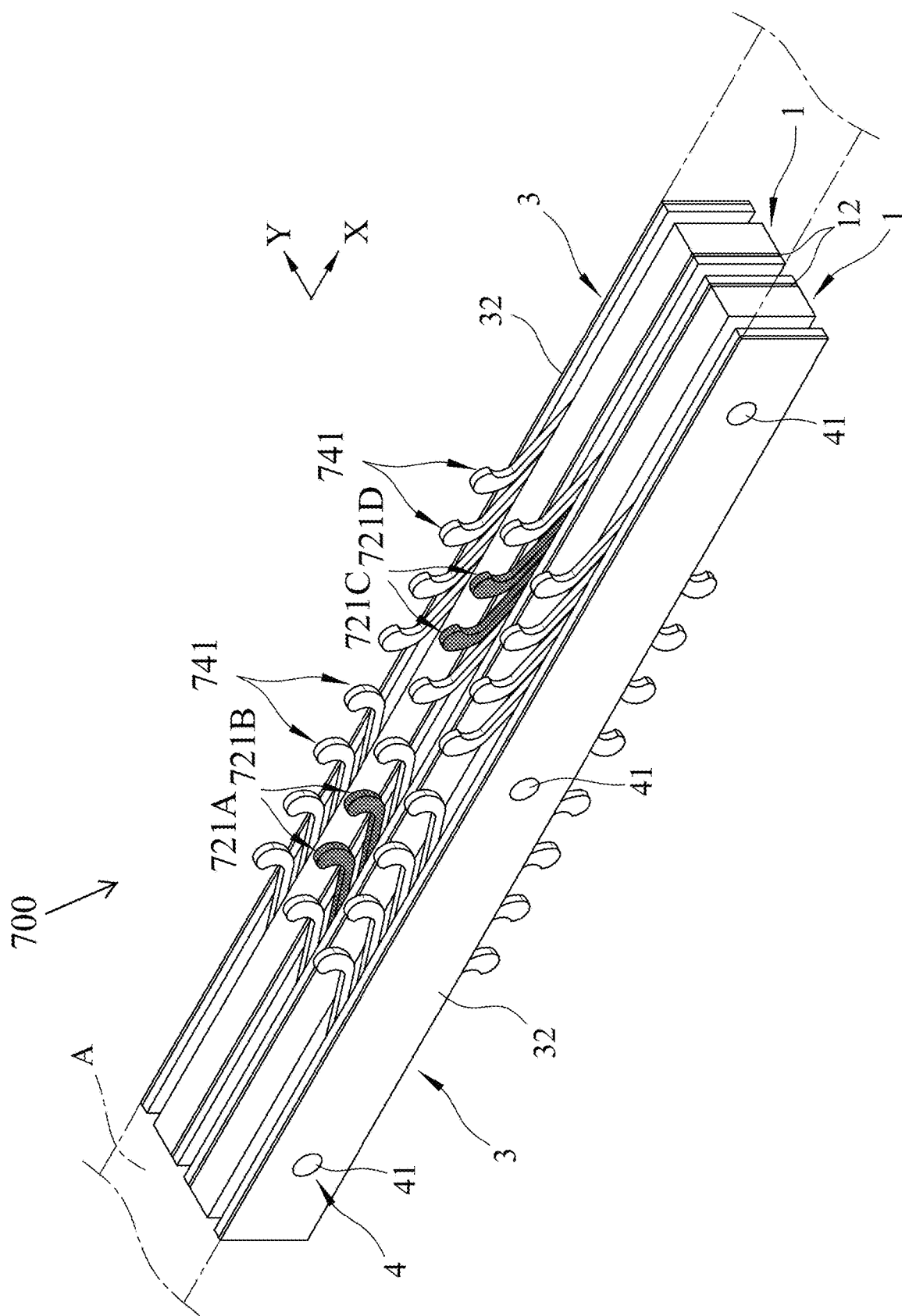
FIG. 7 is a perspective view of an electrical connector showing contact members configured in a specific manner that connect to signal pads in examples of the present disclosure.

FIG. 7 is a perspective view of an electrical connector 700 showing contact members configured in a specific manner that connect to signal pads in examples of the present disclosure. A first selected contact member 721A (shown in dark color) of the second plurality of contact members is connected to a first signal pad. A second selected contact member 721B (shown in dark color) of the second plurality of contact members is connected to a second signal pad. A third selected contact member 721C (shown in dark color) of the second plurality of contact members is connected to a third signal pad. A fourth selected contact member 721D (shown in dark color) of the second plurality of contact members is connected to a fourth signal pad. Remaining contact members of the second plurality of contact members, the first plurality of contact members and the third plurality of contact members 741 are connected to a ground pad.

Figure 8:
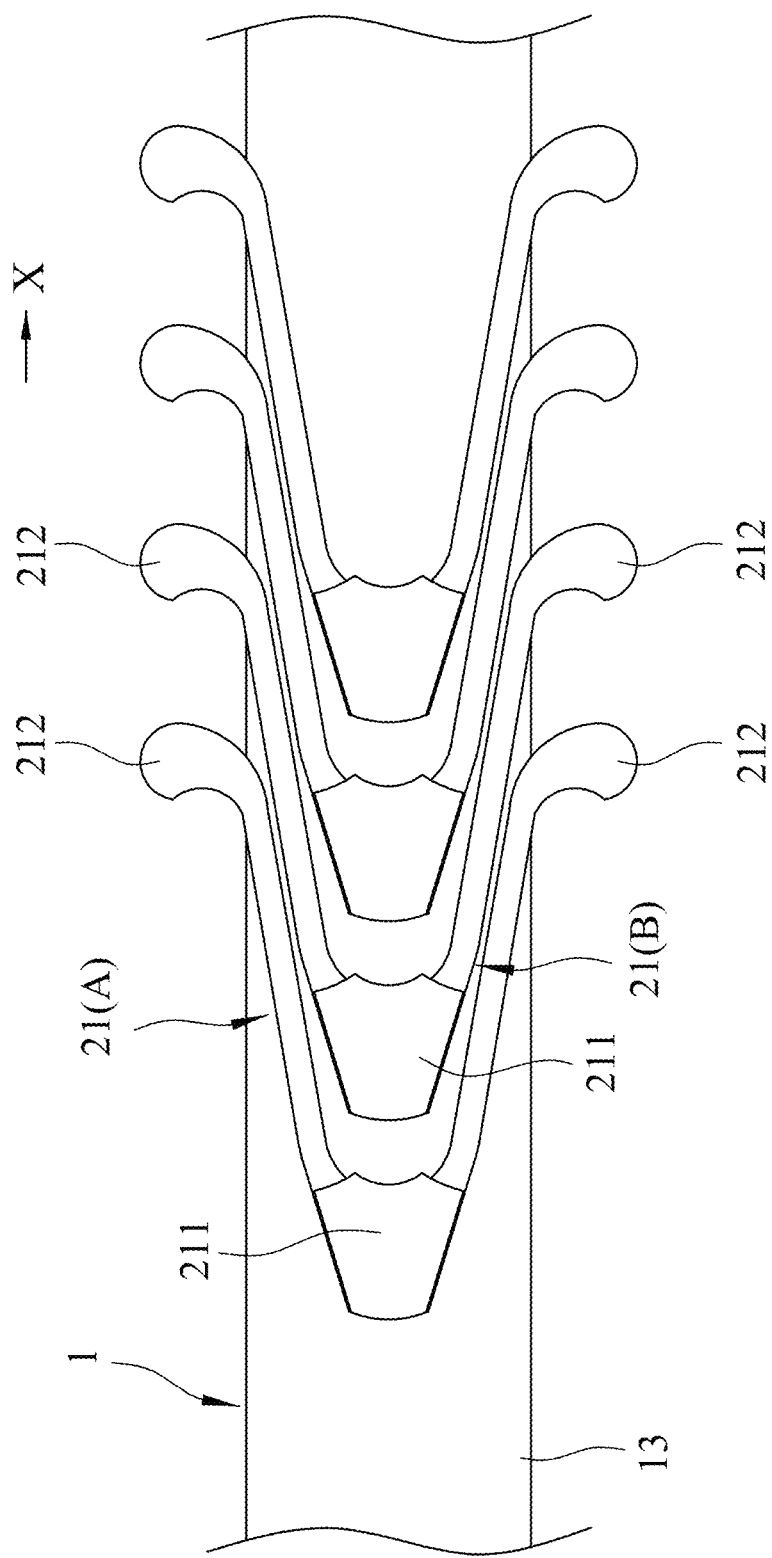
FIG. 8 is a frontal view of deformed contact members in examples of the present disclosure.

FIG. 8 is a frontal view of deformed contact members in examples of the present disclosure. In examples of the present disclosure, under deformation, each contact member still does not touch adjacent contact member.

Figure 9:
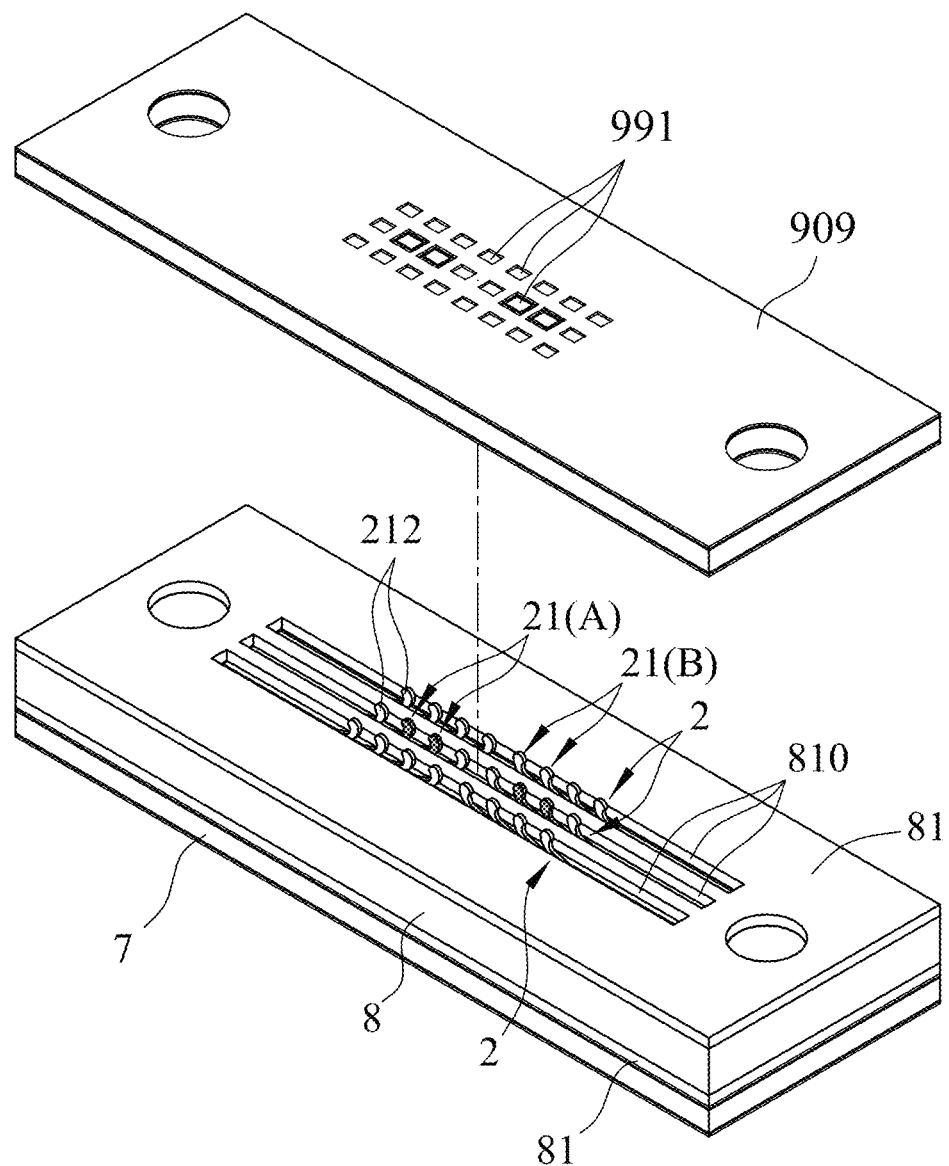
FIG. 9 is an exploded plot showing a device under test in examples of the present disclosure.
Figure 10:
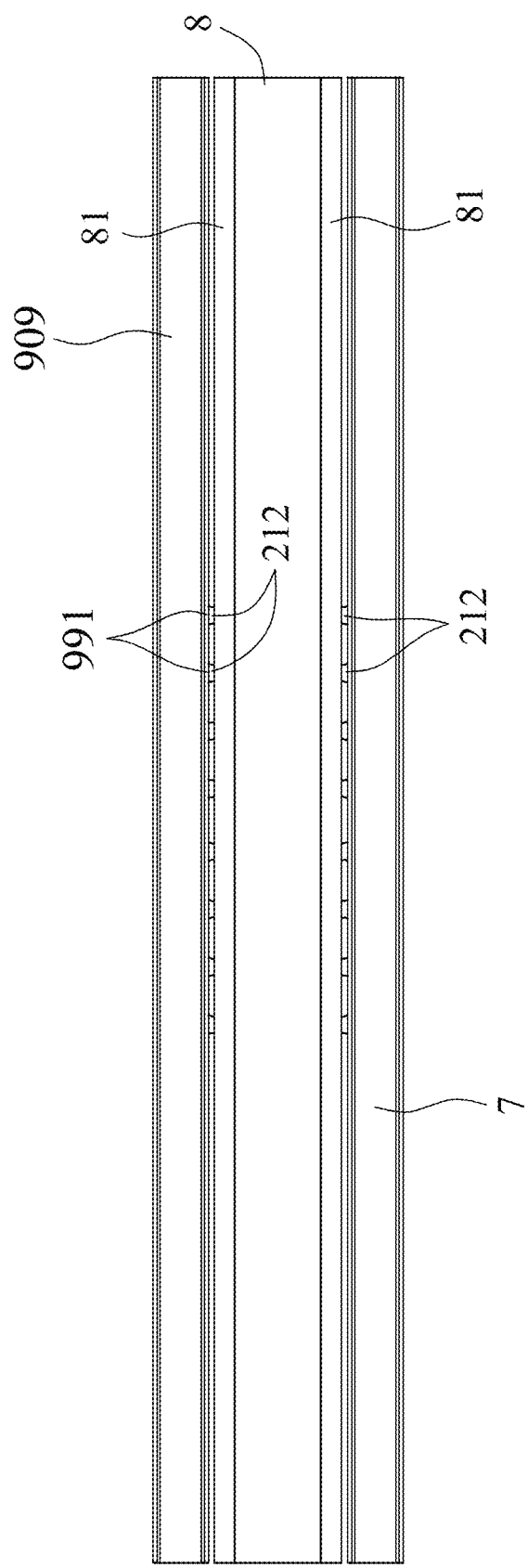
FIG. 10 is an assembled frontal view of FIG. 9 showing an electrically connected apparatus in examples of the present disclosure.

FIG. 9 is an exploded plot and FIG. 10 is a side view showing a device under test in examples of the present disclosure. In examples of the present disclosure, the electrical connector 200 is enclosed in an electrically shielded housing 8 and is above an actuation module 7. The electrically shielded housing 8 has top and bottom shielded surfaces 81. The top and bottom shielded surfaces 81 comprise a plurality of slots 810. The device 909 under test has a plurality of pads 991. In examples of the present disclosure, four pads with dark color are signal pads. Remaining pads are ground pads.

Figure 11:
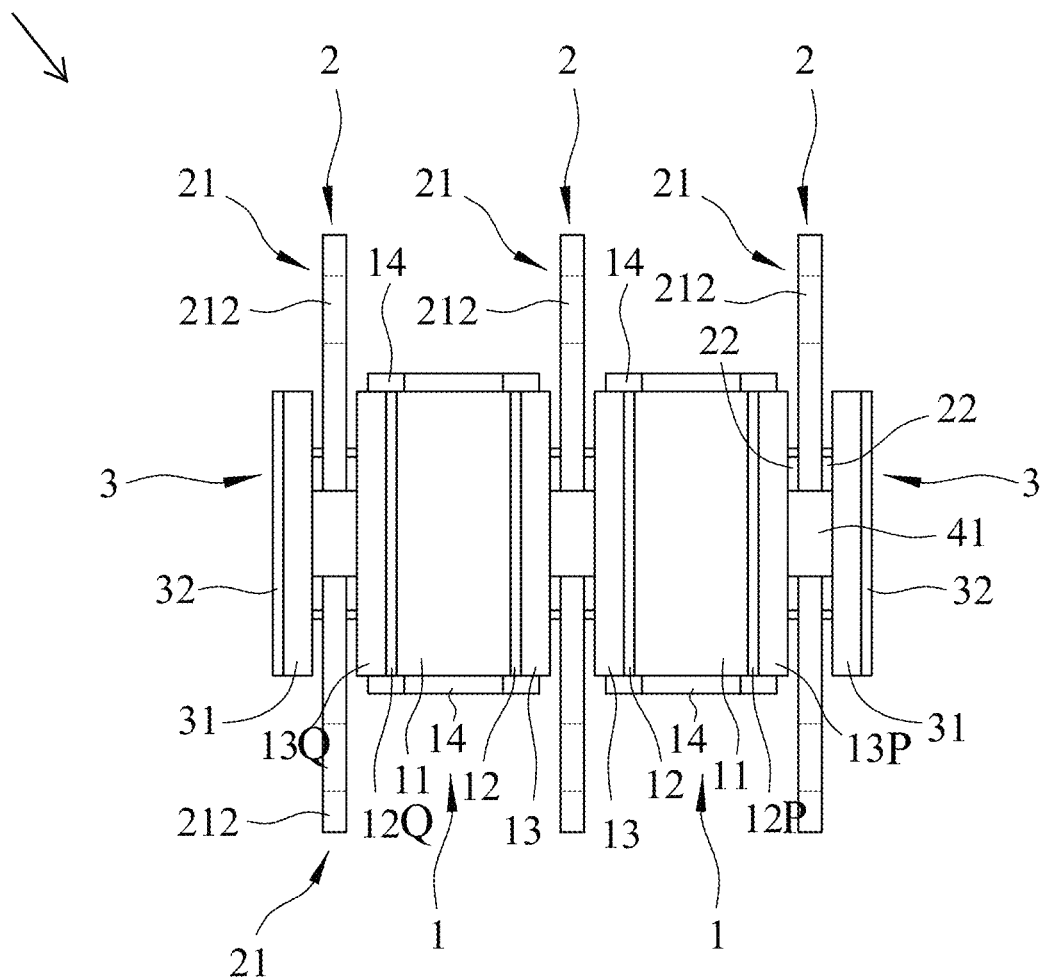
FIG. 11 is an end view of another electrical connector.

FIG. 11 is an end view of an electrical connector 1100. The electrical connector 1100 is similar to the electrical connector 200 except that the electrical connector 1100 includes additional components. The first substrate assembly further comprises a first additional encapsulation layer 13P, a first additional conductive layer 12P, and a capacitor 14. The second substrate assembly further comprises a second additional conductive layer 12Q, a second additional encapsulation layer 13Q, and a capacitor. In examples of the present disclosure, the first additional encapsulation layer 13P has a constant thickness. The first additional conductive layer 12P has a constant thickness. The second additional conductive layer 12Q has a constant thickness. The second additional encapsulation layer 13Q has a constant thickness.

Figure 12:
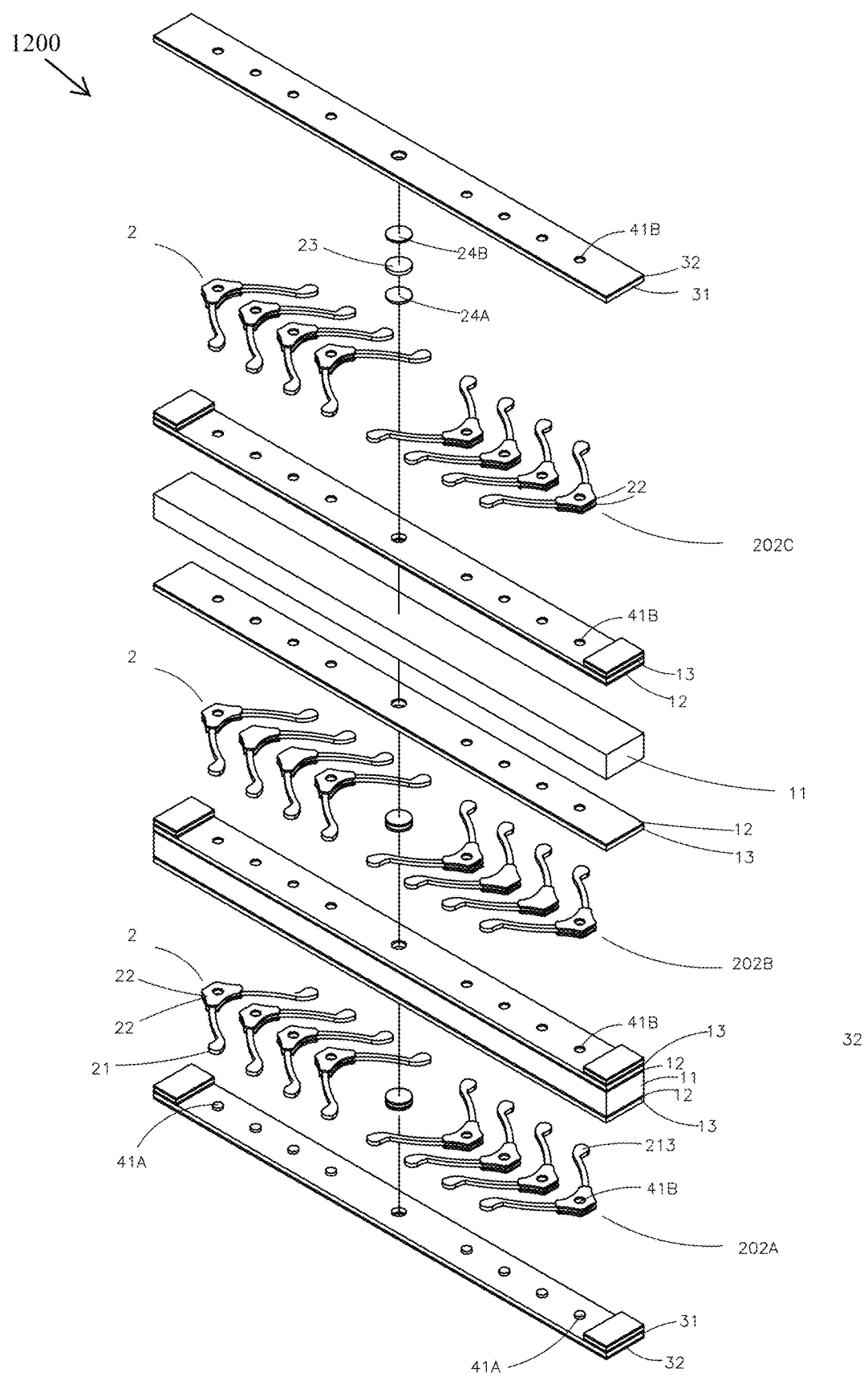
FIG. 12 is an exploded plot of another electrical connector in examples of the present disclosure.
Figure 13:
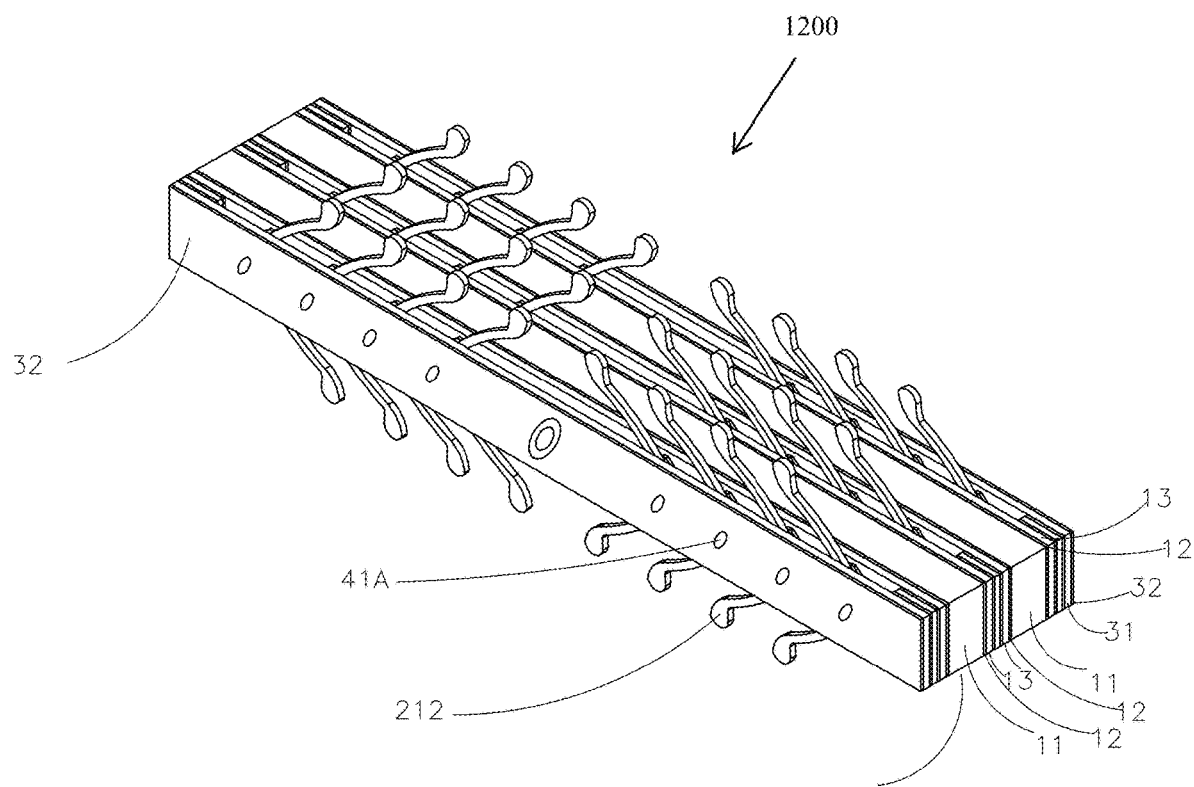
FIG. 13 is an assembled perspective view of the electrical connector of FIG. 12.
Figure 14:
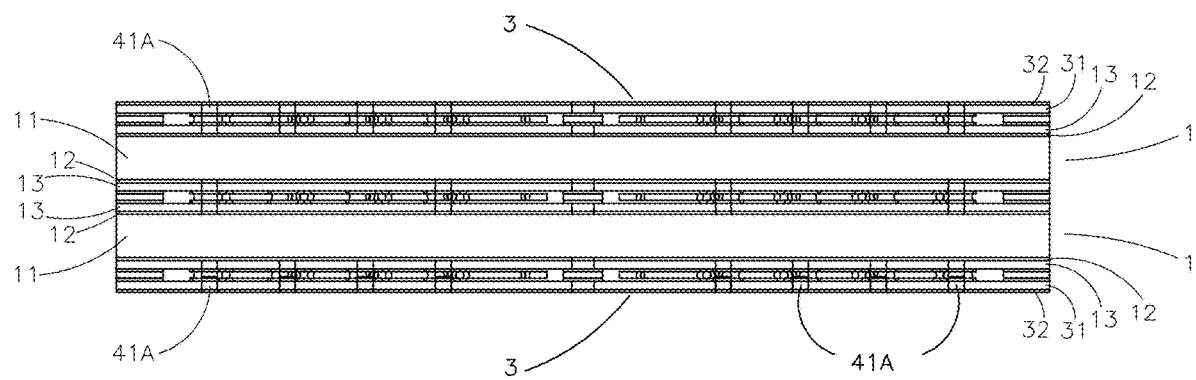
FIG. 14 is a top view of the electrical connector of FIG. 12.
Figure 15:
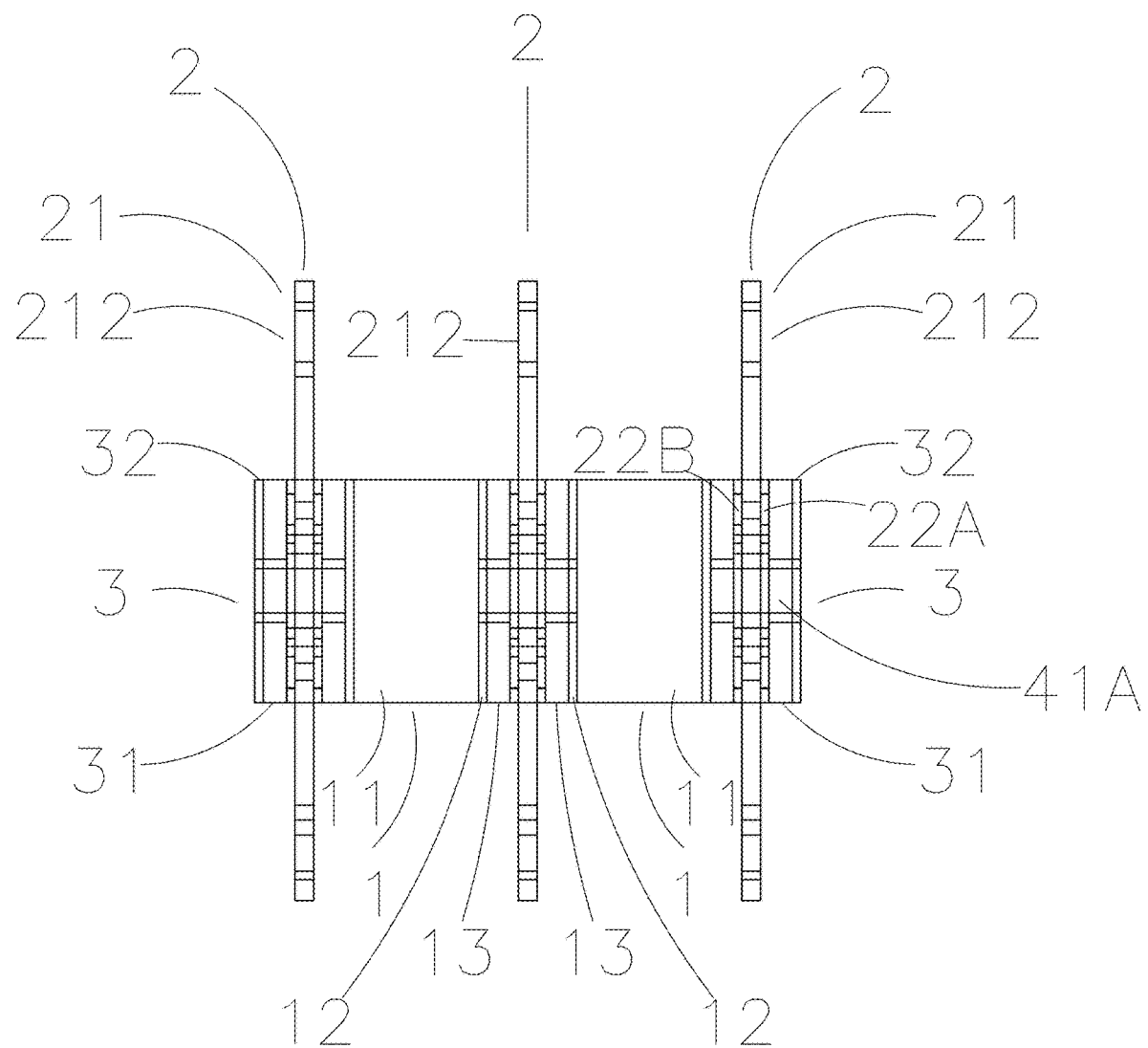
FIG. 15 is an end view of the electrical connector of FIG. 12.

FIG. 12 is an exploded plot of another electrical connector in examples of the present disclosure. An electrical connector 1200 of FIG. 12 is a variant of the electrical connector 200 of FIG. 2. FIG. 13 is an assembled perspective view of the electrical connector of FIG. 12. FIG. 14 is a top view of the electrical connector of FIG. 12. FIG. 15 is an end view of the electrical connector of FIG. 12. The electrical connector 1200 includes a plurality of substrate assemblies 1, a plurality of contact assemblies 2 comprising a plurality of bases 211 and a plurality of arms 212, a plurality of spacers 22, a plurality of surface assemblies 3, and a plurality of conductive columns or vias 41A and 41B interspersed between assemblies of the connector unit 1200.

Those of ordinary skill in the art may recognize that modifications of the embodiments disclosed herein are possible. For example, a total number of contact members in an electrical connector and the approach in which they are electrically configured may vary. Other modifications may occur to those of ordinary skill in this art, and all such modifications are deemed to fall within the purview of the present invention, as defined by the claims.

The invention claimed is:

1. An electrical connector comprising:
   a bottom assembly comprising a bottom insulation layer formed on a bottom conductive layer;
   a first contact assembly comprising a first plurality of contact members formed adjacent to the bottom insulation layer;
   a first substrate assembly comprising a first substrate layer formed adjacent to the first contact assembly, a first conductive layer formed on the first substrate layer, and a first encapsulation layer formed on the first conductive layer;
   a second contact assembly comprising a second plurality of contact members formed adjacent to the first encapsulation layer;
   a second substrate assembly comprising a second encapsulation layer formed adjacent to the second contact assembly, a second conductive layer formed on the second encapsulation layer, and a second substrate layer formed on the second conductive layer;
   a third contact assembly comprising a third plurality of contact members formed adjacent to the second substrate layer; and
   a top assembly comprising a top insulation layer formed adjacent to the third contact assembly and a top conductive layer formed on the top insulation layer; and
   a plurality of conductive columns;
   wherein the plurality of contact members of the first, second and third contact assemblies extend in a first direction from the first and second substrate assemblies, and the bottom assembly, the first contact assembly, the first substrate assembly, the second contact assembly, the second substrate assembly, the third contact assembly, and the top assembly are arranged in the given order in a second direction perpendicular to the first direction; and
   wherein the plurality of conductive columns extend in the second direction to penetrate the bottom assembly, the first substrate assembly, the second substrate assembly, and the top assembly, the plurality of conductive columns electrically connecting the bottom conductive layer, the first conductive layer, the second conductive layer and the top conductive layer.

2. The electrical connector of claim 1, wherein each contact member of the first plurality of contact members, the second plurality of contact members, and the third plurality of contact members comprises
   a base portion;
   a first arm;
   a second arm;
   a first spacer; and
   a second spacer;

wherein the first arm; the base portion; and the second arm form a letter V shape and wherein the first and second spacers are attached to opposite surfaces of the base portion.

3. The electrical connector of claim 2, wherein each of the first contact assembly, the second contact assembly, and the third contact assembly further comprises
a lower spacer;
a center conductive disk; and
an upper spacer;
wherein a top surface of the lower spacer is directly attached to a bottom surface of the center conductive disk;
wherein a bottom surface of the upper spacer is directly attached to a top surface of the center conductive disk;
wherein the plurality of conductive columns comprise
a first conductive column;
a center conductive column; and
a second conductive column;
wherein the first conductive column, the center conductive column, and the second conductive column are arranged along the first direction; and
wherein the center conductive column passes through a center hole of the lower spacer, a center hole of the center conductive disk, and a center hole of the upper spacer.

4. The electrical connector of claim 3, wherein the center conductive disk is of a circular disk shape; and
wherein the center conductive column is of a cylinder shape.

5. The electrical connector of claim 3, wherein a top surface of each first arm of the first plurality of contact members and a top surface of each second arm of the first plurality of contact members are co-planar;
wherein a top surface of each first arm of the second plurality of contact members and a top surface of each second arm of the second plurality of contact members are co-planar; and
wherein a top surface of each first arm of the third plurality of contact members and a top surface of each second arm of the third plurality of contact members are co-planar.

6. The electrical connector of claim 5, wherein the center conductive column is located at an opening side of each letter V shape.

7. The electrical connector of claim 3, wherein the first substrate assembly further comprises a first additional conductive layer formed on the first substrate layer and a first additional encapsulation layer formed on the first additional conductive layer, the first additional encapsulation layer being formed adjacent to the first contact assembly, and further comprises a first capacitor formed at an end of the first substrate assembly.

8. The electrical connector of claim 3, wherein the electrical connector is symmetric with respect to a centerline of the electrical connector;
wherein the centerline is parallel to the first direction;
wherein the electrical connector is symmetric with respect to a symmetric line of the electrical connector;
wherein the symmetric line is perpendicular to the centerline; and
wherein the symmetric line passes through a centroid of the center conductive column.

9. The electrical connector of claim 8, wherein each first arm and second arm comprises
a slender portion; and
an end portion;
wherein a length of the slender portion is larger than a length of the end portion; and wherein a width of the slender portion is smaller than a width of the end portion.

10. The electrical connector of claim 9, wherein a majority portion of the end portion is of an arc shape.

11. The electrical connector of claim 10, wherein a bottom surface of the first spacer of each of the first plurality of contact members directly contacts a top surface of the bottom insulation layer of the bottom assembly;
wherein a top surface of the second spacer of each of the first plurality of contact members directly contacts a bottom surface of the first substrate layer;
wherein a bottom surface of the first spacer of each of the second plurality of contact members directly contacts a top surface of the first encapsulation layer;
wherein a top surface of the second spacer of each of the second plurality of contact members directly contacts the second encapsulation layer;
wherein a bottom surface of the first spacer of each of the third plurality of contact members directly contacts a top surface of the second substrate layer; and
wherein a top surface of the second spacer of each of the third plurality of contact members directly contacts a bottom surface of the top insulation layer of the top assembly.

12. The electrical connector of claim 3, wherein the first substrate assembly and the second substrate assembly are of rectangular prism shapes.

13. The electrical connector of claim 3, wherein a first selected contact member of the second plurality of contact members is connected to a first signal pad;
wherein a second selected contact member of the second plurality of contact members is connected to a second signal pad;
wherein a third selected contact member of the second plurality of contact members is connected to a third signal pad;
wherein a fourth selected contact member of the second plurality of contact members is connected to a fourth signal pad; and
wherein remaining contact members of the second plurality of contact members, the first plurality of contact members and the third plurality of contact members are connected to a ground pad.

14. An electrical connector comprising:
a plurality of substrate assemblies formed between a pair of surface assemblies, each of the substrate assemblies comprising a conductive layer formed between a substrate layer and an insulating layer and each of the surface assemblies comprising an insulating layer and a conductive layer;
a plurality of contact assemblies, each contact assembly being formed between a surface assembly and a substrate assembly or between an adjacent pair of substrate assemblies, each contact assembly comprising a plurality of contact members formed adjacent to the substrate layer or the insulting layers of the respective surface assembly or substrate assembly; and
a plurality of conductive vias,
wherein the plurality of contact members of the plurality of contact assemblies extend from the substrate assemblies in a first direction and the plurality of conductive vias extend in a second direction perpendicular to the first direction to electrically connect at least some of the conductive layers of the plurality of substrate assemblies and the pair of surface assemblies.

15. The electrical connector of claim 14, wherein the plurality of conductive vias penetrate the plurality of substrate assemblies and the pair of surface assemblies in the second direction to electrically connect the conductive layers.

16. The electrical connector of claim 14, wherein the plurality of contact members comprises a first set of contact members to be connected to signal pads, the first set of contact members being surrounded by remaining contact members to be connected to a ground pad.

17. The electrical connector of claim 14, wherein the plurality of contact members of the plurality of contact assemblies extend from a first surface of the substrate assemblies and a second surface of the substrate assemblies, the second surface opposite the first surface in the first direction.

18. The electrical connector of claim 14, wherein each contact member of the plurality of contact members in the plurality of contact assemblies comprises a base portion, first and second art portions extended from the base portion in the first direction, and first and second spacers formed on opposite surfaces of the base portion.

19. The electrical connector of claim 18, wherein each of the substrate assemblies further comprises a second conductive layer formed between the substrate layer and a second insulating layer, and wherein a first set of conductive vias in the plurality of conductive vias extends in the second direction to electrically connect the conductive layers and the second conductive layers of the substrate assemblies and the surface assembles through the base portions of a subset of contact members, remaining contact members being insulated from the plurality of conductive vias.

20. The electrical connector of claim 18, wherein a subset of contact members comprises base portions that are electrically connected to respective conductive vias of the plurality of conductive vias, remaining contact members being insulated from the plurality of conductive vias.

* * * * *